United States Patent [19]

Dennis

[11] Patent Number: 5,015,206

[45] Date of Patent: May 14, 1991

[54] SOLDER TERMINAL

[75] Inventor: Richard K. Dennis, Etters, Pa.

[73] Assignee: Die Tech, Inc., York Haven, Pa.

[21] Appl. No.: 504,946

[22] Filed: Apr. 5, 1990

[51] Int. Cl.⁵ .......................... H01R 4/02; H01R 9/09
[52] U.S. Cl. ...................................... 439/876; 29/874;
439/83
[58] Field of Search .................... 439/83, 876; 29/874, 29/878

[56] References Cited

U.S. PATENT DOCUMENTS

| 3,770,874 | 11/1973 | Krieger et al. | 439/876 X |
| 3,997,237 | 12/1976 | White | 439/876 |
| 4,019,803 | 4/1977 | Schell | 339/275 |
| 4,597,628 | 7/1986 | Seidler | 439/876 |
| 4,900,279 | 2/1990 | Dennis | 439/876 |

OTHER PUBLICATIONS

Keller et al, Statutory invention registration No. H498 7/1988.

Primary Examiner—Eugene F. Desmond
Attorney, Agent, or Firm—Thomas Hooker

[57] ABSTRACT

A solder terminal includes a clip adapted to be positioned on one edge of a substrate for forming soldered electrical connections with substrate pads. One end of the clip extends away from the substrate for making an electrical connection with a circuit component.

17 Claims, 2 Drawing Sheets

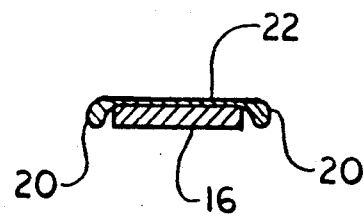
FIG. 4
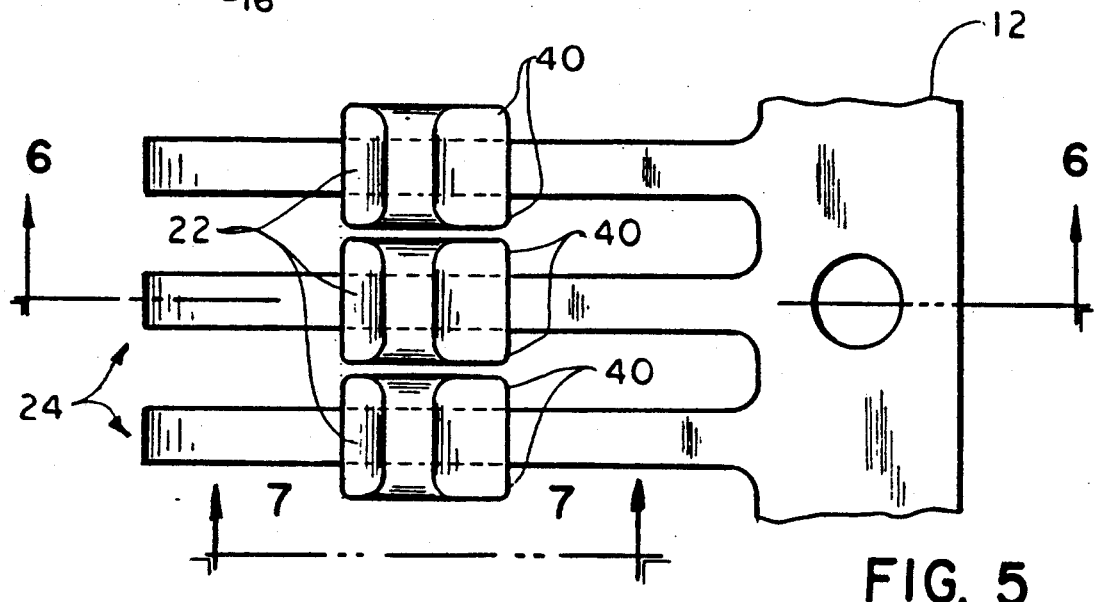
FIG. 5
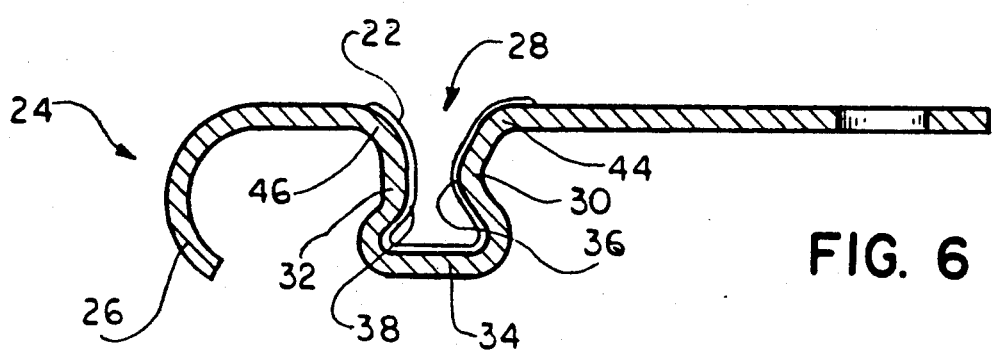
FIG. 6
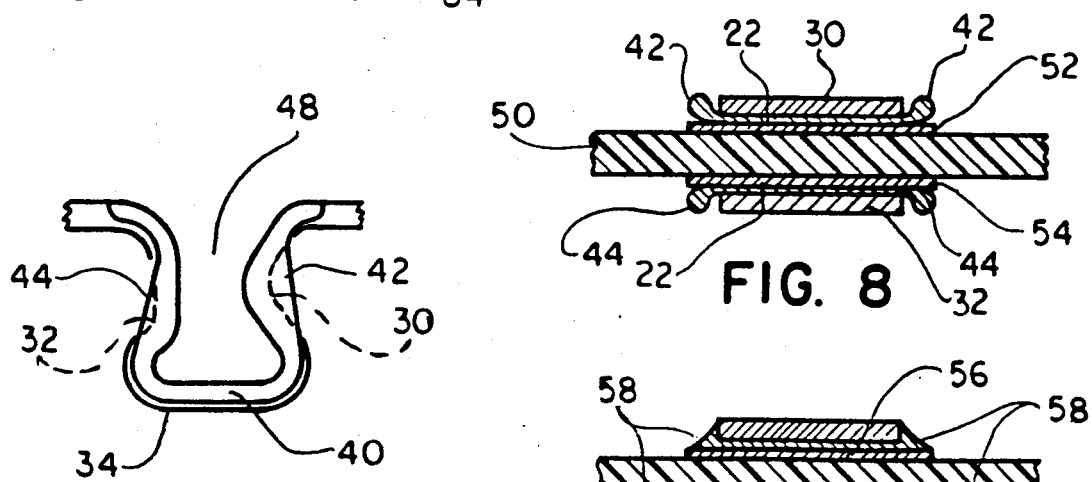
FIG. 7
FIG. 8
FIG. 9

SOLDER TERMINAL

FIELD OF THE INVENTION

The invention relates to solder terminals, particularly solder clips for forming solder connections with contact pads on the edges of substrates.

DESCRIPTION OF THE PRIOR ART

Conventional solder terminals include clips for mounting on the edges of substrates with the interior surfaces of the clips engaging pads on the substrate. The clips carry masses of solder located remote from the clip-substrate contact. Electrical connections are formed between the clips and the pads on the substrate by heating and reflow soldering. This soldering operation requires melting of the solder mass and flowing of the molten solder to the pads. Improper flowing of the solder to the joints risk improper soldered electrical connections between the clip and the pads. Specialized tooling and production techniques are required for physically securing solder masses to the terminals.

One clip-type solder terminal provides a solder mass bonded to the surfaces of the clip which are bent down laterally to either side of central contact ridges extending along the clips. During reflow soldering the solder located away from the contact ridges melts and is drawn into solder fillets extending to either side of the ridges and forming connections between the clip and the contact pads. While this type of solder terminal does work, the manufacture is difficult due to the necessity of bending the contact arms down to either side of the ridges. The ridge-pad contacts between the clips and the substrate pads are relatively unstable making it difficult to maintain solder individual clips in place on the substrate prior to soldering.

SUMMARY OF THE INVENTION

The present solder terminal is formed from a strip of flat metal stock having a reflow adhered solder overlay in the clip-portion. This overlay is coined down onto the flat strip to a uniform thickness of about 0.0005 inch. Coining of the strip extrudes two large volume solder bodies laterally beyond the strip edges. During forming of the clip these bodies remain secured to the strip through the very thin solder layer.

Following coining, a clip is formed by single-curvature bending of the strip. One clip arm includes a flat large area contact surface and the other clip arm includes a contact ridge extending laterally across the strip. The solder masses extend around the U-shaped edges of the clip. The solder terminals are inexpensively and rapidly mass produced by a relatively simple stamping, coining and single curvature forming operations.

The solder terminal is mounted on a substrate by moving the clip over the substrate edge so that the contact surface and ridge rest on opposed contact pads. The substrate has a thickness greater than the spacing between the surfaces so that the flexible bridge joining the clip arms is stressed and biases the contact surface and ridge against the pads and holds the thin solder layers flush on the flat pads.

The mounted clip is electrically connected to the pads by heating and reflow soldering. Heating and melting of the thin solder layers confined between the clip arms and pads forms integral solder connections between the arms and the contact surfaces and pads. These connections are formed by the solder in the thin layer. The large volume solder reservoirs located to the sides of the clip are melted and are drawn by capillary action into the corners surrounding the contact surface and ridge to form large volume strong solder fillets surrounding the two contact joints. The fillets form the electrical and physical connections between the clip and the contact pads.

Other objects and features of the invention will become apparent as the description proceeds, especially when taken in conjunction with the accompanying drawings illustrating the invention, of which there are 2 sheets and one embodiment.

BRIEF DESCRIPTION OF THE DRAWINGS

FIG. 4 is a sectional view taken along line 4—4 of FIG. 3;

FIG. 5 is a view like FIG. 1 showing the formed solder terminal;

FIGS. 6 and 7 are views taken along lines 6—6 and 7—7 respectively of FIG. 5;

FIG. 8 is a cross sectional view showing the arms of the clip shown in FIG. 6 mounted on a substrate prior to reflowing soldering; and FIG. 9 is a sectional view similar to FIG. 8 following reflow solder and formation of a permanent electrical connection between the terminal and pads on the substrate.

DESCRIPTION OF THE PREFERRED EMBODIMENT

Figure 1:
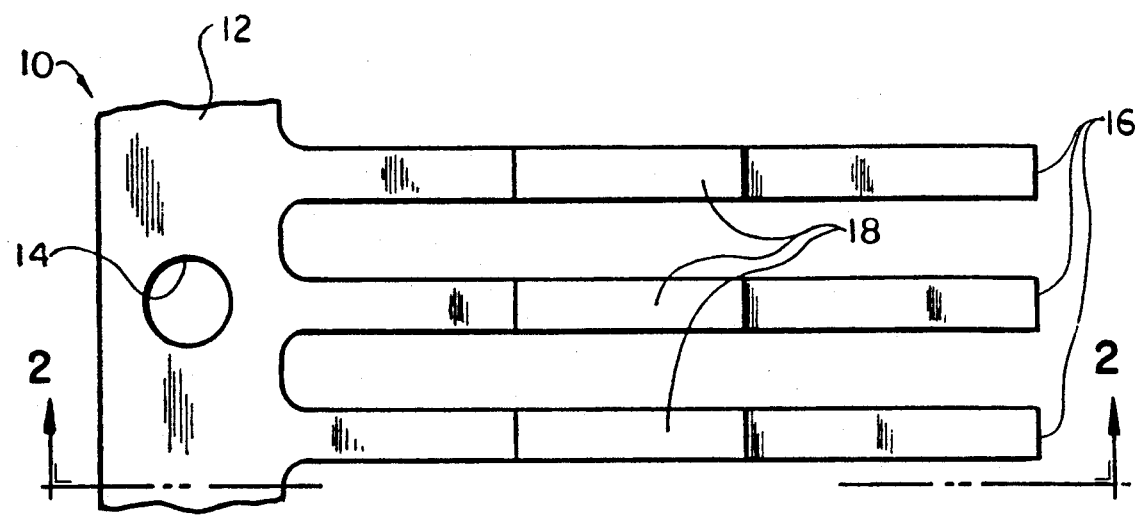
FIG. 1 is a top view of a flat solder terminal preform stamped from strip stock with a solder strip overlay.

FIG. 1 shows a flat solder terminal preform 10 including elongate carrier strip 12 with regularly spaced pilot holes 14 formed along the length of the strip. A plurality of spaced flat metal terminal strips 16 extend to one side of the carrier strip. Each terminal strip includes a flat solder overlay 18 integrally bonded to the strip, preferably by reflow soldering. The overlays 18 are located centrally on strips 16. The preform 10 is preferably stamp formed from a metal strip with a continuous solder overlay extending down the middle of strips 16 by blanking away the sections of the strip and solder overlay between adjacent terminal strips 16.

Figure 2:
FIG. 2 is a sectional view taken along the line 2—2 of FIG. 1.
Figure 3:
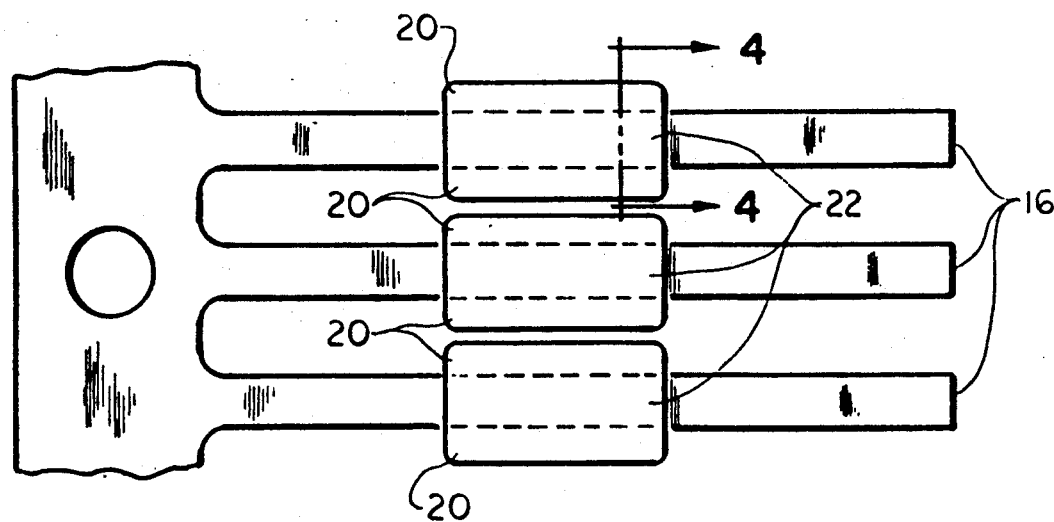
FIG. 3 is a view like FIG. 1 following coining of the solder.

The strips 16 may have a thickness of about 0.008 inch and a width of about 0.02 inch. The solder overlay 18 may have a thickness of about 0.004 inch and projects above the strips 16 as shown in FIG. 2.

Following manufacture of preform 10, the solder overlays 18 are coined to flatten the solder above the strip 16 and extrude the solder laterally beyond the edges of the strips. The extruded solder forms relatively thick and large volume solder masses 20 extending along the edges of each terminal strip 16. The working face of the coining tool is parallel to the flat top of the strip 16 and is lowered through a sufficient distance to reduce the thickness of the solder and form a thin solder layer 22 directly overlying the strip having a thickness of about 0.0005 inch. This thin layer is integrally bonded to the strip. The flat outer surface of layer 22 continues over the solder bodies 20 as illustrated in FIG. 4. The coining operation flows or extrudes the major portion of the overlay solder into the solder bodies 20 located outside of the strips 16.

Following coining of the solder overlays 18, the flat terminal strips 16 are bent along their length to the configuration shown in FIGS. 5 and 6. Easily formed single curvature bends are made along the strips to form solder clip terminals 24 each having a free contact end 26 and a substrate clip 28 located medially along the length of the terminal. The coined solder layer 22 extends around the interior of clip 28 and along each clip arm 30 and 32 and the bridge 34 joining the ends of the arms. Arm 30 includes an inwardly facing contact ridge 36 extending across the width of the arm. Arm 32 includes a flat contact surface 38 facing ridge 36.

During forming of the solder terminals 24, the straight solder bodies 20 of preform 10 remain joined to the solder layer 22 and are bent around the edges of clip 28 as shown in FIGS. 5 and 7 to form generally U-shaped solder reservoirs 40 extending around each edge of the clip along the edges of the arms and bridge. As shown in FIG. 7, the reservoirs 40 include portions 42 and 44 having a greater thickness than the adjacent clip arms 30 and 32 and projecting distance outwardly beyond the arms. The thin solder layer 22 and reservoirs 40 extend completely around the interior of the clip. The clip lead in portions 44 and 46 open into an interior clip recess 48 located between the flat wall 38 of clip arm 32 and the ridge 36 of clip arm 30.

Solder clip terminals 24 are mounted on substrate 50 as shown in FIG. 8. The edge of the substrate is piloted between the lead-in portions 44 and 46 and the clip is then pushed on the board to position arms 30 and 32 on a pair of contact pads 52 and 54 on the substrate. The width of the substrate and pads is slightly greater than the minimum spacing between clip arms in the terminal 24 so that the clip is stressed and the arms are held tightly on the pads. Arms 30 and 32 are separated from the pads by the thin solder layer 22. The clip is oriented on the board by flush engagement between the flat pad 54 and the flat surface 38 of arm 32. The contact ridge 36 of arm 30 rests flush of pad 52.

With the solder terminal mounted on the substrate as shown in FIG. 8 permanent electrical solder connections are established between the arms and the pads by heating and reflow soldering. Heating the solder clip melts the thin solder layer 22 between the arms and the contact pads to form, when cooled, a thin solder layer 56 extending across the full width of each arm and integrally bonding overlying arm surfaces to the pads 52 and 54. This bonding solder layer has a thickness of about 0.0005 inch.

The solder reservoirs 40 located along each edge of the clip are melted during reflow soldering and flow to strong solder fillets 58 forming integral solder connections between the edges of the clips and the edges of the contact pads. These solder fillets are drawn by capillary action across the width of the arms where the arms extend away from the pads to form a continuous solder fillet at each arm completely surrounding the solder bond layer 56.

Following reflow soldering of the terminals 24 to substrate 50 the strip 12 is broken away from the individual terminals to electrically isolate the individual terminals. Contacts 26 form electrical connections between the terminal pads and other circuit elements. Terminal 24 may include other types of contacts for forming electrical connections with circuit elements. For instance, the ends of the terminal may be left straight and soldered in contact holes formed through a support member or may be joined to another circuit element through a connector block.

During heating and reflow soldering of the clip to substrate 50 as shown in FIG. 9, the thin layers 22 melt and form reflowed soldered connections integrally joining the overlying clip arms to the underlying contact pads without appreciable migration of additional solder into the interface between the arms and pads. The solder reservoirs 42 and 44 then flow into the circumference surrounding the preflowed solder layers 56 thereby improving the physical connection between the arms and the pads and contributing to the electrical connection between the arms and the pads.

Solder terminals 24 form reliable soldered electrical connections with pads. These connections are more reliable than the connections formed using conventional solder terminals where discreet solder masses are physically secured remote from the contact site. During reflow soldering of these terminals the solder masses must melt and migrate to the contact site for forming a solder connection between the clip arms and the substrate pads. Difficulty is encountered in reliably flowing the molten solder into the interface between the clip arms and pads.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A solder terminal including a contact element and a first arm joined to the element, the arm having a flat base with opposed edges, and in integral solder mass comprising a thin flat solder layer integrally bonded to the base and a pair of solder reservoirs extending along the edges of the base and joined to the thin solder layer only.

2. A solder terminal as in claim 1 wherein the solder reservoirs are located below the thin solder layer.

3. A solder terminal as in claim 2 wherein the thin solder layer and solder reservoirs are coined from a single solder mass bonded to the flat base and the reservoirs are extrusion-formed.

4. A solder terminal as in claim 1 including a clip having a second arm located adjacent the first arm and a bridge joining the arms, said base facing the second arm.

5. A solder terminal as in claim 4 wherein said second arm includes a contact ridge facing the base.

6. A solder terminal as in claim 5 wherein the contact ridge extends across the width of the other arm.

7. A solder terminal as in claim 4 including a continuous, thin U-shaped layer extending around the interior surfaces of the arms and the bridge, the thin flat solder layer forming part of the U-shaped layer, and U-shaped solder reservoirs are integral with the thin shaped layer and each extending around one side edge of the clip.

8. A solder terminal as in claim 7 wherein the thin solder layer has a thickness of approximately 0.0005 inch and such layer and solder reservoirs are coined from a single solder mass bonded to the arms and bridge.

9. A solder terminal including a contact for establishing an electrical connection with circuit elements and a clip at one end of the contact, said clip including first and second opposed contact arms and a bridge joining said arms, the interior surface of one arm including a flat base facing the other arm, the interior surface of the other arm including a transverse contact ridge facing the one arm, and an integral solder mass including a thin U-shape solder layer extending around and bonded to the interior surfaces of the clip arms and bridge and overlying the flat base and the contact ridge and a pair of U-shaped solder reservoirs located at the lateral strip edges and joined to the edges of the thin solder layer only.

10. A solder terminal as in claim 9 wherein said thin solder layer is approximately 0.0005 inches thick.

11. A solder terminal as in claim 10 wherein said reservoirs extend outwardly beyond the arms at the contact surface and ridge.

12. The method of manufacturing a solder terminal having a solder coated contact with integral solder reservoirs including the steps of:

a. bonding a solder body to a portion of a terminal strip having side edges; and b. coining the solder body to reduce the thickness of the solder overlying the strip, form a thin solder strip and extrude such solder laterally past both edges of the strip and form large volume solder reservoirs extending along the edges of the strip.

13. The method of claim 12 including the step of forming said solder reservoirs below the surface of the thin solder strip.

14. The method of claim 12 including the step of forming said portion into a contact clip having opposed arms and a bridge joining the arms.

15. The method of claim 14 including the step of forming U-shaped solder reservoirs extending around both edges of the clip.

16. The method of claim 14 including the step of forming a flat contact surface on one clip arm and a contact ridge on the other clip arm across from the contact surface.

17. The method of claim 16 including forming said contact ridge extending across the width of the contact portion.

* * * * *